(12) United States Patent
Hertwig et al.

(10) Patent No.: US 12,730,143 B2
(45) Date of Patent: Sep. 8, 2026

(54) PROBE SYSTEMS AND METHODS OF OPERATING PROBE SYSTEMS

(71) Applicant: FormFactor, Inc., Livermore, CA (US)

(72) Inventors: Jörg Hertwig, Radeberg (DE); Benedikt Marx, Dresden (DE)

(73) Assignee: FormFactor, Inc., Livermore, CA (US)

( * ) Notice: Subject to any disclaimer, the term of this patent is extended or adjusted under 35 U.S.C. 154(b) by 122 days.

(21) Appl. No.: 18/948,055

(22) Filed: Nov. 14, 2024

(65) Prior Publication Data

US 2025/0067799 A1 Feb. 27, 2025

Related U.S. Application Data

(60) Provisional application No. 63/571,072, filed on Mar. 28, 2024.

(51) Int. Cl.
*G01R 31/28* (2006.01)
*G01R 1/067* (2006.01)

(52) U.S. Cl.
CPC ..... *G01R 31/2889* (2013.01); *G01R 1/06727* (2013.01); *G01R 31/2887* (2013.01)

(58) Field of Classification Search
CPC ............ G01R 31/2889; G01R 1/06727; G01R 31/2887
See application file for complete search history.

(56) References Cited

U.S. PATENT DOCUMENTS

| | | | | |
|---|---|---|---|---|
| 8,142,700 | B2 * | 3/2012 | Sitti | G03F 7/0017 264/220 |
| 2009/0269560 | A1 * | 10/2009 | Dhinojwala | B81C 1/00111 428/206 |
| 2018/0252765 | A1 * | 9/2018 | Nagashima | G01R 1/07307 |
| 2019/0064594 | A1 * | 2/2019 | Wang | G02F 1/133608 |
| 2019/0277885 | A1 * | 9/2019 | Beng | G01R 31/2886 |
| 2023/0062076 | A1 * | 3/2023 | Hsu | G01L 5/00 |

* cited by examiner

*Primary Examiner* — Alvaro E Fortich
(74) *Attorney, Agent, or Firm* — KOLITCH ROMANO DASCENZO GATES LLP

(57) ABSTRACT

Probe systems and methods of operating probe systems. The probe systems include a chuck that defines a support surface. The probe systems also include a cover plate. The probe systems further include a probe positioner that includes a positioner base, a manipulator that extends from the positioner base, and a probe arm that extends from the manipulator. The probe systems also include a probe operatively attached to the probe arm and a positioner attachment structure that separably attaches the positioner base to the cover plate. The positioner attachment structure includes an attachment structure body that defines a positioner base-facing side and a cover plate-facing side. The positioner attachment structure also includes an adhesive material that adheres the positioner base-facing side to the positioner base. The cover plate-facing side of the attachment structure body defines a micropatterned dry adhesive that separably attaches the attachment structure body to the cover plate.

20 Claims, 3 Drawing Sheets

88
90
70
86
84
82
80
78
50
52
54
68
42
66
76
40
64
74
88
86
72
34
10
84
90
62
60
36
30

92

PROBE SYSTEMS AND METHODS OF OPERATING PROBE SYSTEMS

RELATED APPLICATION

This application claims priority to U.S. Provisional Patent Application No. 63/571,072, which was filed on Mar. 28, 2024, and the complete disclosure of which is hereby incorporated by reference.

FIELD OF THE DISCLOSURE

The present disclosure relates generally to probe systems and to methods of operating probe systems.

BACKGROUND OF THE DISCLOSURE

Probe systems often include positioners, which may be utilized to position probe tips relative to a device under test (DUT) that is formed on a substrate. The positioners often are mounted to a cover plate and include a manipulator and a probe arm. The probe arm extends from the manipulator and is configured to be moved, relative to the cover plate, by the manipulator. A probe may be attached to the probe arm and utilized to test the DUT via contact and/or non-contact testing methodologies. For some probe systems, such as those that are utilized in an engineering and/or product development environment, it may be desirable to change a location of the positioners on the cover plate. Historically, manipulators have been attached to cover plates via a variety of conventional attachment mechanisms, including mechanical fasteners, magnetic attachment, and/or vacuum attachment. While effective in certain circumstances, each of these conventional attachment mechanisms also exhibits significant drawbacks. For example, mechanical fasteners often are time-consuming to utilize, may be easily lost, and typically only permit certain relative orientations between the probe assembly and the top plate (e.g., at locations that are configured to receive the mechanical fasteners). Magnetic and vacuum attachment may not exhibit the limitations of mechanical fasteners; however, magnetic attachment requires the use of ferromagnetic materials, which may interfere with certain measurements that may be performed by the probe system. Vacuum attachment only may provide limited attachment forces, may be ineffective in a vacuum environment, and may require relatively complex hardware configurations, as well as a vacuum supply, which may be complex, costly, and/or unreliable. Probe systems that exhibit one or more of the above-described limitations may be ineffective in certain circumstances and/or may be utilized in only limited testing scenarios. Thus, there exists a need for improved probe systems and methods of operating probe systems.

SUMMARY OF THE DISCLOSURE

Probe systems and methods of operating probe systems are disclosed herein. The probe systems include a chuck that defines a support surface configured to support a substrate that includes a device under test. The probe systems also include a cover plate that defines a chuck-facing side, which faces toward the support surface, and a chuck-opposed side, which faces away from the support surface. The probe systems further include a probe positioner that includes a positioner base, a manipulator that extends from the positioner base, and a probe arm that extends from the manipulator. The probe systems also include a probe operatively attached to the probe arm. The probe systems further include a positioner attachment structure that separably attaches the positioner base to the cover plate. The positioner attachment structure includes an attachment structure body that defines a positioner base-facing side and a cover plate-facing side. The positioner attachment structure also includes an adhesive material that adheres the positioner base-facing side to the positioner base. The cover plate-facing side of the attachment structure body defines a micropatterned dry adhesive that separably attaches the attachment structure body to the cover plate.

The methods include detaching a probe positioner of the probe system from a first location on a cover plate of the probe system. The detaching includes separating a micropatterned dry adhesive of a positioner attachment structure of the probe system from the cover plate while retaining the positioner attachment structure adhesively attached to a positioner base of the probe positioner. The methods also include attaching the probe positioner to a second location on the cover plate. The second location differs from the first location, and the attaching includes contacting the micropatterned dry adhesive with the cover plate.

DETAILED DESCRIPTION AND BEST MODE OF THE DISCLOSURE

Figure 1:
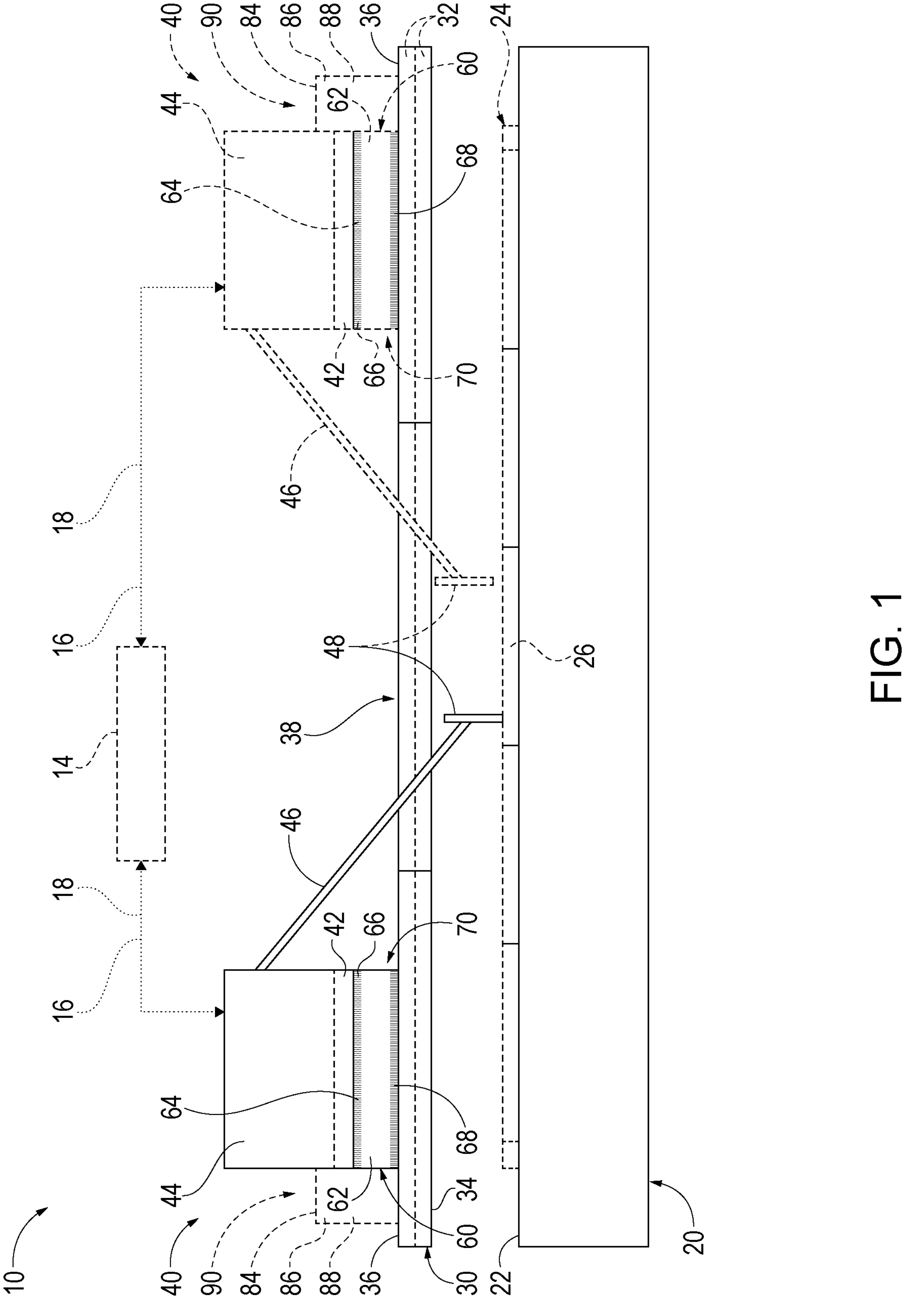
FIG. 1 is a schematic illustration of examples of a probe system according to the present disclosure.

FIGS. 1-4 provide examples of probe systems 10 and/or methods 100, according to the present disclosure. Elements that serve a similar, or at least substantially similar, purpose are labeled with like numbers in each of FIGS. 1-4, and these elements may not be discussed in detail herein with reference to each of FIGS. 1-4. Similarly, all elements may not be labeled in each of FIGS. 1-4, but reference numerals associated therewith may be utilized herein for consistency. Elements, components, and/or features that are discussed herein with reference to one or more of FIGS. 1-4 may be included in and/or utilized with any of FIGS. 1-4 without departing from the scope of the present disclosure.

In general, elements that are likely to be included in a particular embodiment are illustrated in solid lines, while elements that may be optional are illustrated in dashed lines. However, elements that are shown in solid lines may not be essential to all embodiments and, in some embodiments, may be omitted without departing from the scope of the present disclosure.

Figures 2, 3:
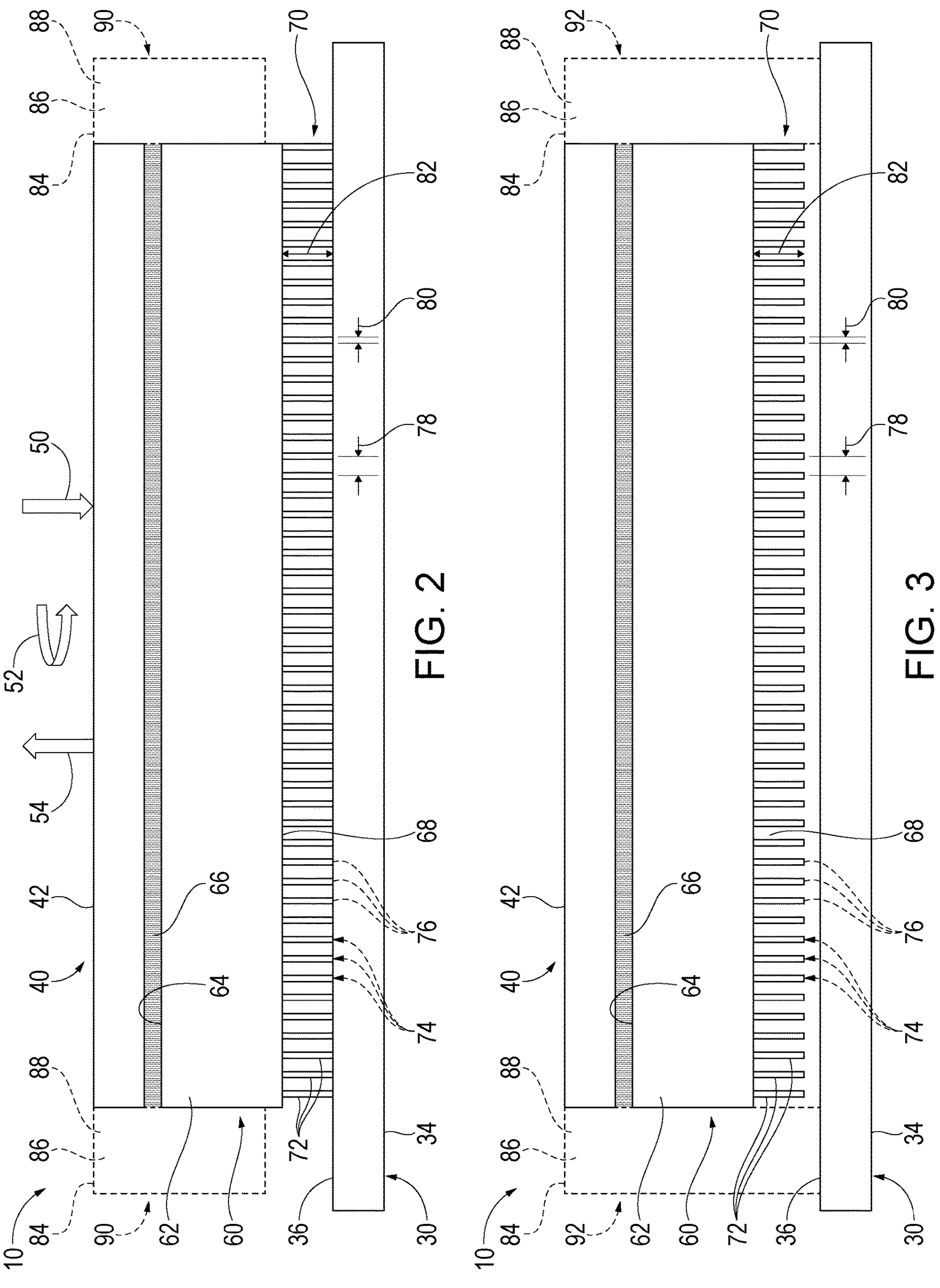
FIG. 2 is a more detailed view illustrating examples of a region of the probe system of FIG. 1.
FIG. 3 is another more detailed view illustrating examples of a region of the probe system of FIG. 1.

FIG. 1 is a schematic illustration of examples of a probe system 10 according to the present disclosure, while FIGS. 2-3 are more detailed views illustrating examples of a region of the probe system of FIG. 1. As perhaps best illustrated in FIG. 1, probe systems 10 include a chuck 20 that defines a support surface 22, which is configured to support a substrate 24 that includes a device under test (DUT) 26. Probe systems 10 also include a cover plate 30. Cover plate 30 may define a chuck-facing side 34, which faces toward support surface 22, and a chuck-opposed side 36, which faces away from support surface 22. Probe systems 10 further include at least one probe positioner 40 that includes a positioner base 42, a manipulator 44 that extends from the positioner base, and a probe arm 46 that extends from the manipulator. Probe systems 10 also include at least one probe 48 that is operatively attached to probe arm 46.

Probe systems 10 further include a positioner attachment structure 60. Positioner attachment structure 60 separably, operably, and/or adhesively attaches positioner base 42 to cover plate 30, such as to chuck-opposed side 36 of the cover plate. Positioner attachment structure 60 includes an attachment structure body 62 that defines a positioner base-facing side 64 and a cover plate-facing side 68. The positioner attachment structure also includes an adhesive material 66 that attaches and/or adheres positioner base-facing side 64 to positioner base 42. Cover plate-facing side 68 of attachment structure body 62 defines a micropatterned dry adhesive 70, which separably attaches and/or adheres attachment structure body 62 to cover plate 30, such as to chuck-opposed side 36 thereof.

In some examples, and as illustrated in dashed lines in FIG. 1, probe systems 10 may include a plurality of positioners 40. In such a configuration, probe systems 10 also include a plurality of corresponding probes 48 and plurality of corresponding positioner attachment structures 60.

During operative use of probe systems 10, and as discussed in more detail herein with reference to methods 100, it may be desirable to change a location of a given probe positioner 40 with respect to and/or on cover plate 30. As an example, when the given probe positioner is at a given location on cover plate 30, certain test locations of DUT 26 may be inaccessible to a corresponding probe 48 that is positioned by the given probe positioner. As such, changing the location of the given probe positioner with respect to the cover plate may permit the corresponding probe to access new, additional, and/or other test locations of the DUT. As another example, one or more probe positioners 40 may be positioned, on cover plate 30, to provide access of corresponding probes 48 to corresponding test locations for a given DUT that includes a different relative orientation among the corresponding test locations. However, it may be desirable to test a different DUT that includes a different relative orientation among corresponding test locations; and changing the location of one or more probe positioners 40 may permit and/or facilitate testing of the different DUT.

Probe systems 10 that include positioner attachment structures 60, according to the present disclosure, may be configured to permit and/or facilitate repeated attachment of one or more probe positioners 40 at any desired location on cover plate 30 and subsequent detachment of the one or more probe positioners from the cover plate. This may provide increased flexibility, improved economics, increased reliability, and/or an overall simpler probe system when compared to conventional probe systems that utilize conventional attachment mechanisms to attach corresponding probe positioners to corresponding cover plates. As discussed in more detail herein with reference to methods 100, the repeated attachment and/or detachment may be performed without damage to and/or destruction of the cover plate, the probe positioner, and/or the positioner attachment structure.

As an example, and in contrast to conventional attachment mechanisms that utilize mechanical fasteners, probe systems 10, according to the present disclosure, permit operative attachment of probe positioners 40 at any desired, or even an infinite number of, relative orientations with respect to cover plate 30. As another example, and in contrast to mechanical fasteners, positioner attachment structure 60 remains attached to probe positioner 40 when probe positioner 40 is detached from cover plate 30 and thus cannot be dropped, lost, and/or otherwise rendered inoperable. As yet another example, and in contrast to mechanical fasteners, positioner attachment structure 60 may be attached to and/or detached from cover plate 30 without the need for additional tools.

As another example, and in contrast to conventional attachment mechanisms that utilize a magnetic force to retain a corresponding probe positioner on a corresponding cover plate, probe systems 10, according to the present disclosure, do not require that ferromagnetic materials be utilized in cover plate 30 and/or probe positioner 40, thereby permitting these structures to be fabricated from a wider variety of materials. As another example, and in contrast to the conventional attachment mechanisms that utilize magnetic force, probe systems 10 are not required to expose the DUT to a magnetic field, which may alter one or more properties of the DUT and/or may be detrimental to certain tests of the DUT.

As another example, and in contrast to conventional attachment mechanisms that utilize a vacuum force to retain a corresponding probe positioner on a corresponding cover plate, probe systems 10, according to the present disclosure, do not require additional facilities (e.g., vacuum generation hardware), together with corresponding vacuum conduits, vacuum application structures, and the like. As yet another example, and in contrast to the conventional attachment mechanisms that utilize the vacuum force, positioner attachment structure 60 will retain probe positioner 40 adhered to cover plate 30 during a power outage. As another example, positioner attachment structure 60 may generate an attachment force that is significantly greater than a maximum magnitude of vacuum attachment forces. In particular, and while vacuum attachment forces cannot exceed 1.01 $kg/cm^2$, positioner attachment structure 60 may be significantly larger, with examples of these attachment forces being discussed in more detail herein. In addition, conventional attachment mechanisms that utilize the vacuum force may be ineffective in a vacuum environment (i.e., when the entire conventional attachment mechanism is within the vacuum environment. However, the effectiveness of positioner attachment structure 60 may be unaffected by the vacuum environment.

As used herein, the phrase "micropatterned dry adhesive" refers to a prefabricated array of structures that protrudes and/or projects from a base layer and is configured and utilized to adhere the base layer to a surface, such as to cover plate 30 and/or to chuck-opposed side 36 thereof, via Van der Waals interactions between the array of structures and the base layer. Stated differently, and in contrast with conventional adhesives, micropatterned dry adhesives are preformed 2-dimensional arrays of 3-dimensional, solid structures that attach to a corresponding surface via Van der Waals interactions with the surface. In some examples, micropatterned dry adhesives may be configured to adhere to the surface only via Van der Waals interactions.

Micropatterned dry adhesives 70 may be prefabricated and/or preformed in any suitable manner. As examples, micropatterned dry adhesives utilized herein may be formed via micromachining, additive manufacturing, and/or lithographic processes. Stated differently, micropatterned dry adhesives 70 may include and/or be micromachined micropatterned dry adhesives, 3-D printed micropatterned dry adhesives, and/or lithographically defined micropatterned dry adhesives.

As perhaps best illustrated in FIGS. 2-3, micropatterned dry adhesives 70 may include a plurality of surface extensions 72. Surface extensions 72 may extend away from positioner base-facing side 64 of attachment structure body 62 and/or may define a two-dimensional array of surface extensions 72. Examples of surface extensions 72 include columns, pillars, cylinders, and/or filaments.

Surface extensions 72 may have and/or define any suitable relative spacing, pitch, and/or average pitch 78 between adjacent surface extensions 72. Examples of the relative spacing, the pitch, and/or the average pitch 78 between adjacent surface extensions 72 include at least 20 microns (μm), at least 25 μm, at least 30 μm, at least 35 μm, at least 40 μm, at least 45 μm, at least 50 μm, at least 55 μm, at least 60 μm, at least 65 μm, at least 70 μm, at least 75 μm, at least 80 μm, at most 120 μm, at most 110 μm, at most 100 μm, at most 90 μm, at most 80 μm, at most 70 μm, at most 60 μm, at most 50 μm, at most 40 μm, and/or at most 30 μm.

Surface extensions 72 also may have and/or define any suitable transverse diameter and/or effective diameter 80. Examples of the diameter and/or of the effective diameter 80 of surface extensions 72 include at least 10 μm, at least 15 μm, at least 20 μm, at least 25 μm, at least 30 μm, at most 60 μm, at most 55 μm, at most 50 μm, at most 45 μm, at most 40 μm, at most 35 μm, at most 30 μm, at most 25 μm, and/or at most 20 μm.

Surface extensions 72 may have and/or define any suitable length, longitudinal length, or projection distance 82 away from cover plate-facing side 68. Examples of the length, the longitudinal length, and/or the projection distance 82 away from cover plate-facing side 68 include at least 25 μm, at least 30 μm, at least 35 μm, at least 40 μm, at least 45 μm, at least 50 μm, at least 55 μm, at least 60 μm, at least 65 μm, at least 70 μm, at least 75 μm, at least 80 μm, at most 120 μm, at most 110 μm, at most 100 μm, at most 90 μm, at most 80 μm, at most 70 μm, at most 60 μm, at most 50 μm, and/or at most 40 μm.

Surface extensions 72 may have and/or define a free end region 74, which may be in contact with, may be adhered to, and/or may be configured to be adhered to cover plate 30 via, and in some examples only via, Van der Waals interactions between the free end region and the cover plate. Examples of free end region 74 include a flat free end region, an at least partially flat free end region, a planar free end region, an at least partially planar free end region, an arcuate free end region, an at least partially arcuate free end region, a suction cup-shaped free end region, an at least partially concave free end region, an at least substantially flat or planar free end region, and/or an at least partially convex free end region. In some examples, free end region 74 may form and/or define a cover plate-contacting pad 76, which may be configured to contact and/or to adhere to cover plate 30 and/or chuck-opposed side 36 thereof.

Micropatterned dry adhesive 70 and/or cover plate 30 may be configured such that the micropatterned dry adhesive and the cover plate define and/or exhibit any suitable pull-off force therebetween. Examples of the pull-off force include at least 1 kilograms per centimeter squared ($kg/cm^2$) of contact area between the micropatterned dry adhesive and the cover plate, at least 1.2 $kg/cm^2$, at least 1.4 $kg/cm^2$, at least 1.6 $kg/cm^2$, at least 1.8 $kg/cm^2$, at least 2 $kg/cm^2$, at most 4 $kg/cm^2$, at most 3.5 $kg/cm^2$, at most 3 $kg/cm^2$, at most 2.5 $kg/cm^2$, or at most 2 $kg/cm^2$. A pull-off force between adhesive material 66 and positioner base 42 may be greater than a pull-off force between micropatterned dry adhesive 70 and cover plate 30, or chuck-opposed side 36 thereof. Similarly, a pull-off force between adhesive material 66 and positioner base-facing side 64 of attachment structure body 62 may be greater than the pull-off force between the micropatterned dry adhesive and the cover plate, or the chuck-opposed side thereof. Such a configuration may permit and/or facilitate repeated attachment and detachment between positioner attachment structure 60 and cover plate 30 while retaining the positioner attachment structure adhered to position base 42.

Attachment structure body 52, micropatterned dry adhesive 70, and/or surface extensions 72 may be formed and/or defined by any suitable material and/or materials, examples of which include an elastomeric material, a polymeric material, and/or an elastomeric polymer. In some examples, attachment structure body 52 may include and/or be a unitary and/or monolithic attachment structure body that forms and/or defines positioner base-facing side 62, cover plate-facing side 68, micropatterned dry adhesive 70, and/or surface extensions 72. Micropatterned dry micropatterned dry adhesive 70 may be in contact, or in direct physical contact, with cover plate 30, such as to permit and/or facilitate attachment therebetween via Van der Waals interactions.

In some examples, adhesive material 66 may include and/or be another, or a different, micropatterned dry adhesive. In some examples, adhesive material 66 may include and/or be a conventional adhesive, examples of which include an epoxy adhesive, a polyurethane adhesive, a polyimide adhesive, a pressure-sensitive adhesive, a contact adhesive, a non-reactive adhesive, and/or a reactive adhesive. Adhesive material 66 may be in contact, or in direct physical contact, with positioner base-facing side 64 of attachment structure body 62 and/or with positioner base 42.

As discussed in more detail herein, micropatterned dry adhesive 70 may be configured to permit and/or to facilitate repeated attachment to and/or detachment from cover plate 30 without damage to the micropatterned dry adhesive and/or to the cover plate. This may be accomplished in any suitable manner. As an example, micropatterned dry adhesive 70 may be positioned on cover plate 30, pressed against cover plate 30, and/or urged toward cover plate 30 to establish adhesion between the micropatterned dry adhesive and the cover plate.

As another example, and as illustrated in FIG. 2, a normal force 50 of greater than a threshold normal force magnitude may be applied between positioner base 42 and cover plate 30 to facilitate detachment of the micropatterned dry adhesive from the cover plate. Application of normal force 50 may bend and/or buckle surface extensions 72, thereby disrupting contact between the surface extensions and cover plate 30, decreasing a contact area between the surface extensions and the cover plate, and/or decreasing Van der Waals interactions between the surface extensions and the cover plate. This may decrease the adhesive force between the micropatterned dry adhesive and the cover plate, thereby permitting and/or facilitating detachment of the micropatterned dry adhesive from the cover plate.

As another example, and as also illustrated in FIG. 2, a rotational force 52 of greater than a threshold rotational force magnitude may be applied between positioner base 42 and cover plate 30 to facilitate detachment of the micropatterned dry adhesive from the cover plate. Application of the rotational force may deform surface extensions 72, thereby disrupting contact between the surface extensions and cover plate 30, decreasing a contact area between the surface extensions and the cover plate, and/or decreasing Van der Waals interactions between the surface extensions and the cover plate. This may decrease the adhesive force between the micropatterned dry adhesive and the cover plate thereby permitting and/or facilitating detachment of the micropatterned dry adhesive from the cover plate.

As yet another example, and as also illustrated in FIG. 2, a separation force 54 of greater than the pull-off force between the micropatterned dry adhesive and the cover plate may be applied to positioner base 42 to facilitate detachment of the micropatterned dry adhesive from the cover plate. Application of the separation force may overcome the adhesive force between the micropatterned dry adhesive and the cover plate, thereby permitting and/or facilitating detachment of the micropatterned dry adhesive from the cover plate.

In some examples, and as illustrated in dashed lines in FIGS. 1-3, positioner attachment structure 60 may include an actuator 84, which may be configured to facilitate detachment of micropatterned dry adhesive 70 from cover plate 30. As an example, and as illustrated by the transition from the configuration that is illustrated in FIG. 2 to the configuration that is illustrated in FIG. 3, actuator 84 may be configured to press against cover plate 30, such as to generate a separation force and/or a separation torque that separates at least a region of micropatterned dry adhesive 70 from cover plate 30. Stated differently, actuator 84 may define an attached orientation 90, as illustrated in FIGS. 1-2, in which the actuator permits contact between the micropatterned dry adhesive and the cover plate. Additionally or alternatively, actuator 84 may define a detached orientation 92, as illustrated in FIG. 3, in which the micropatterned dry adhesive is inaccessible to the cover plate, does not contact the cover plate, and/or cannot contact the cover plate.

Actuator 84 may include any suitable structure. As examples, actuator 84 may include a lever arm 86 and/or a button 88, which may be configured to provide a mechanical advantage to separate at least the region of the micropatterned dry adhesive from the cover plate. In some examples, such as is illustrated in FIGS. 2-3 with actuator 84 being positioned on two opposed sides of positioner base 42, the actuator may be configured to translate the positioner attachment structure relative to the cover plate to facilitate separation of the positioner attachment structure from the cover plate. In some examples, such as is illustrated in FIG. 1 with actuator 84 being positioned on a single side of positioner base 42, the actuator may be configured to pivot and/or to rotate the positioner attachment structure relative to the cover plate to facilitate separation of the positioner attachment structure from the cover plate.

As discussed in more detail herein, probe systems 10 that utilize positioner attachment structures 60, according to the present disclosure, may provide several distinct benefits over conventional probe systems that include and/or utilize conventional attachment mechanisms for corresponding positioners. With this in mind, it is within the scope of the present disclosure that probe systems 10 and/or positioner attachment structure 60 may be free of a vacuum attachment mechanism, a magnetic attachment mechanism, a ferromagnetic material, and/or a mechanical fastener that extends between the probe positioner and the cover plate and/or that attaches the probe positioner to the cover plate. It is also within the scope of the present disclosure that probe systems 10 and/or positioner attachment structures 60 may be configured to facilitate attachment of probe positioners 40 to cover plate 30 and/or separation of the probe positioners from the cover plate without, or without utilizing, a tool, a separate tool that is distinct from the positioner attachment structure, a screwdriver, and/or a wrench.

Chuck 20 may include any suitable structure that defines support surface 22 and/or that supports substrate 24. Examples of chuck 20 include a vacuum chuck, a temperature-controlled chuck, and/or an electrically shielded chuck.

Cover plate 30 may include any suitable structure to which positioner attachment structure 60 may be separably and adhesively attached, that defines chuck-facing side 34, and/or that defines chuck-opposed side 36. Examples of cover plate 30 include a metallic cover plate 30 and/or a glass cover plate 30, which may define chuck-facing side 34 and/or chuck-opposed side 36. Additional examples of cover plate 30 include a platen, a housing, a shell, a cover, a rigid cover plate, an at least substantially rigid cover plate, and/or an enclosure.

In some examples, and as illustrated in FIG. 1, cover plate 30 may include a plurality of layers 32, or distinct layers 32, each of which may be incorporated into probe system 10 for a specific purpose. As an example, one layer 32 may be metallic, while another layer 32 may be glass. In such examples, positioner attachment structure 60 may be mounted to the glass layer, the glass layer may define chuck-opposed side 36, and/or the metallic layer may define chuck-facing side 34. Such a configuration may permit the metallic layer to provide structural support, or a majority of the structural support, for probe positioners 40, while the glass layer provides a relatively smoother surface to which positioner attachment structure 60 may be adhered.

Positioner attachment structures 60 and/or micropatterned dry adhesives 70 thereof may exhibit improved and/or increased adhesion to relatively smoother surfaces. With this in mind, cover plate 30, a surface of cover plate 30 to which positioner attachment structure 60 is adhered, chuck-facing side 34, and/or chuck-opposed side 36 may have and/or define a threshold surface roughness. Examples of the threshold surface roughness include a surface roughness of at most 5 μm Roughness Average (Ra), at most 4 μm Ra, at most 3 μm Ra, at most 2 μm Ra, at most 1 μm Ra, at most 0.8 μm Ra, at most 0.6 μm Ra, at most 0.5 μm Ra, at most 0.4 μm Ra, at most 0.3 μm Ra, at most 0.2 μm Ra, or at most 0.1 μm Ra.

Probe positioner 40 may include any suitable structure that includes and/or defines positioner base 42, manipulator 44, and/or probe arm 46 and/or that is configured to operatively translate probe 48 relative to one or more structures of probe system 10, such as chuck 20, support surface 22, positioner base 42, and/or cover plate 30. This may include operative translation, via motion of probe arm 46, in at least one direction, in at least two perpendicular, or at least substantially perpendicular, directions, or in three orthogonal, or at least substantially orthogonal, directions.

Positioner 40 and/or manipulator 44 thereof may include any suitable structure and may be manually and/or electrically actuated. As examples, positioner 40 and/or manipulator 44 may include a rack and pinion assembly, a lead screw and nut assembly, a ball screw and nut assembly, a handle configured to be manually actuated by an operator of the probe system, an electric actuator, an electric motor, a servo motor, a stepper motor, and/or a piezoelectric positioning device.

Probe 48 may include any suitable structure that may be configured to be operatively attached to probe arm 46 and/or to communicate with DUT 26. Examples of probe 48 include an electrical probe, a contact probe, a non-contact probe, a wireless probe, an electromagnetic probe, and/or an optical probe.

As illustrated in dashed lines in FIG. 1, probe systems 10 also may include a signal generation and analysis assembly 14. Signal generation and analysis assembly 14 may be configured to provide a test signal 16 to DUT 26, such as via a corresponding probe 48, and/or to receive a resultant signal 18 from DUT 26, such as via a corresponding probe 48. Examples of test signal 16 and/or resultant signal 18 include an electric signal, an electric current, an electric voltage, an electromagnetic signal, and/or an optical signal.

Substrate 24 may include any suitable substrate that may include, support, and/or have formed thereon DUT 26. Examples of substrate 24 include a wafer, a semiconductor wafer, a silicon wafer, a Group III-V semiconductor wafer, a glass substrate, and/or a metallic substrate. DUT 26 may include any suitable device that may be tested by probe system 10 and/or included and/or defined on substrate 24. Examples of DUT 26 include a semiconductor device, a solid-state device, a solid-state electronic device, a solid-state optical device, and/or a solid-state optoelectronic device.

Figure 4:
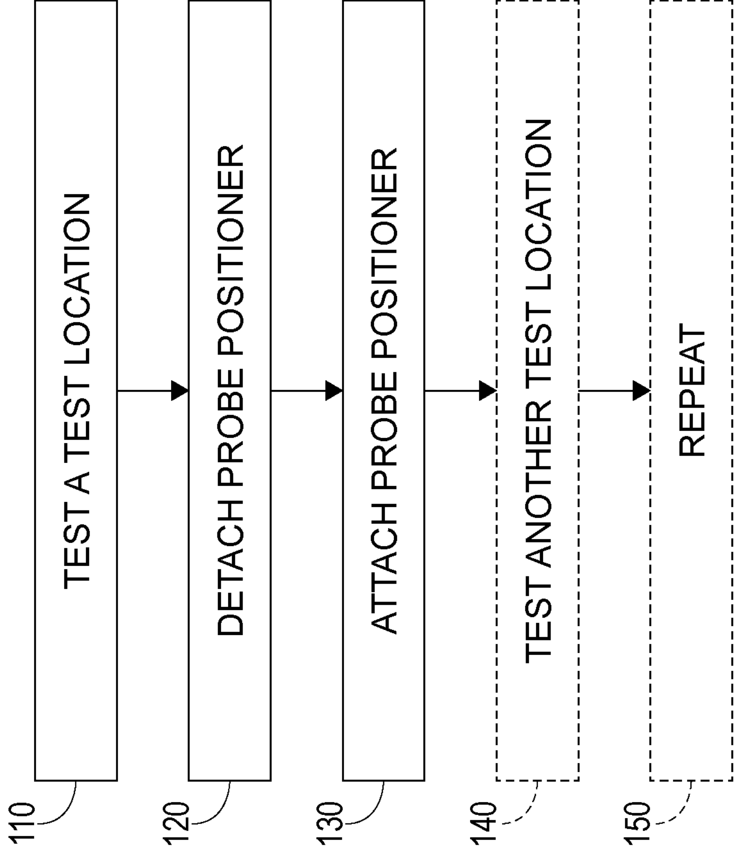
FIG. 4 is a flowchart depicting examples of methods of operating probe systems, according to the present disclosure.
Figure 4:

FIG. 4 is a flowchart depicting examples of methods 100 of operating probe systems, according to the present disclosure. Methods 100 may include testing a test location at 110, and methods 100 include detaching a probe positioner at 120 and attaching the probe positioner at 130. Methods 100 also may include testing another test location at 140 and/or repeating at least a subset of the methods at 150.

Testing the test location at 110 may include testing any suitable test location of any suitable device under test in any suitable manner. This may include testing the test location with, via, and/or utilizing a probe of the probe system. The probe may be operatively attached to a probe arm that extends from the probe positioner, and the testing may include aligning the probe with the test location utilizing the probe positioner. Examples of the probe system, the probe, the probe arm, and the probe positioner are disclosed herein with reference to probe systems 10, probe 48, probe arm 46, and probe positioner 40, respectively.

The testing at 110 may include performing any suitable test on the test location. As an example, the testing at 110 may include providing a test signal to the test location via the probe. As another example, the testing at 110 may include receiving a resultant signal from the test location via the probe. Examples of the test signal and/or of the resultant signal are disclosed herein with reference to test signal 16 and resultant signal 18, respectively.

The testing at 110 may be performed with any suitable timing and/or sequence during methods 100. As examples, the testing at 110 may be performed prior to the detaching at 120, prior to the attaching at 130, prior to the testing at 140, and/or prior to the repeating at 150.

Detaching the probe positioner at 120 may include detaching the probe positioner from a first location on a cover plate of the probe system. The detaching at 120 may include separating a micropatterned dry adhesive of a positioner attachment structure of the probe system from the cover plate. The detaching at 120 also may include retaining the positioner attachment structure adhesively attached to a positioner base of the probe system. Examples of the cover plate are disclosed herein with reference to cover plate 30. Examples of the micropatterned dry adhesive, the positioner attachment structure, and the positioner base are disclosed herein with reference to micropatterned dry adhesive 70, positioner attachment structure 60, and positioner base 42, respectively.

The detaching at 120 may be accomplished in any suitable manner. As an example, the detaching at 120 may include applying at least a threshold normal force between the positioner base and the cover plate, such as to decrease a pull-off force between the micropatterned dry adhesive and the cover plate. As another example, the detaching at 120 may include applying at least a threshold rotational force between the positioner base and the cover plate to decrease the pull-off force between the micropatterned dry adhesive and the cover plate. As yet another example, the detaching at 120 may include applying a separation force, which is greater than the pull-off force between the micropatterned dry adhesive and the cover plate, between the positioner base and the cover plate. As another example, the detaching at 120 may include actuating an actuator of the positioner attachment structure, such as to transition the actuator from an attached orientation to a detached orientation. Examples of the actuator, the attached orientation, and the detached orientation are disclosed herein with reference to actuator 84, attached orientation 90, and detached orientation 92, respectively.

The detaching at 120 may be performed with any suitable timing and/or sequence during methods 100. As an example, the detaching at 120 may be performed subsequent to the testing at 110. As additional examples, the detaching at 120 may be performed prior to the attaching at 130, the testing at 140, and/or the repeating at 150.

Attaching the probe positioner at 130 may include attaching the probe positioner to a second location on the over plate. The second location may differ from the first location, and the attaching at 130 may include contacting, directly contacting, and/or physically contacting, the micropatterned dry adhesive with the cover plate.

The attaching at 130 may be accomplished in any suitable manner. As an example, the attaching at 130 may include applying at least a threshold attachment force between the probe positioner base and the cover plate, such as to compress the micropatterned dry adhesive between the probe positioner base and the cover plate and/or to establish contact between the micropatterned dry adhesive and the cover plate. The threshold attachment force may be sufficient to establish adhesion between the micropatterned dry adhesive and the cover plate. Additionally or alternatively, the threshold attachment force may be less than the threshold normal force and/or may be insufficient to bend and/or buckle surface extensions of the micropatterned dry adhesive and thus may not disrupt contact between the surface extensions and the cover plate. As another example, the attaching at 130 may include actuating the actuator of the positioner attachment structure, such as to transition the actuator from the detached orientation to the attached orientation.

The attaching at 130 may be performed with any suitable timing and/or sequence during methods 100. As examples, the attaching at 130 may be performed subsequent to the testing at 110 and/or to the detaching at 120. As additional examples, the attaching at 130 may be performed prior to the testing at 140 and/or to the repeating at 150.

In contrast with conventional probe systems that utilize conventional attachment mechanisms to attach corresponding probe positioners to corresponding cover plates, the detaching at 120 and/or the attaching at 130 may be performed without actuating a vacuum attachment mechanism, without utilizing a magnetic attachment mechanism, and/or without utilizing a mechanical fastener. Additionally or alternatively, the detaching at 120 and the attaching at 130 may be performed without utilizing a tool, a separate tool that is distinct from the positioner attachment structure, a screwdriver, and/or a wrench.

Testing the other test location at 140 may include testing another test location of the device under test utilizing the probe and may be performed subsequent to the attaching at 130. The other test location may differ from the test location that was tested during the testing at 110. Stated differently, the detaching at 120 and the attaching at 130 may permit and/or facilitate access to the other test location, which may have been inaccessible to the probe prior to the detaching at 120, prior to the attaching at 130, and/or during the testing at 110.

Additionally or alternatively, the testing the other test location at 140 may include testing the other test location on another device under test utilizing the probe and may be performed subsequent to the attaching at 130. The other device under test may differ from the device under test that was tested during the testing at 110. Stated differently, the detaching at 120 and the attaching at 130 may permit and/or facilitate access to the other test location on the other device under test, and this other test location may have been inaccessible to the probe prior to the detaching at 120 and/or prior to the attaching at 130.

Repeating at least the subset of the methods at 150 may include repeating any suitable step and/or steps of methods 100 in any suitable order and/or for any suitable purpose. As an example, the repeating at 150 may include sequentially repeating the detaching at 120 and the attaching at 130 a plurality of times. This may include repeating the detaching at 120 and the attaching at 130 without replacing the micropatterned dry adhesive of the positioner attachment structure and/or without damage to the micropatterned dry adhesive of the positioner attachment structure. In some examples, the repeating at 150 may include cleaning the cover plate during consecutive instances of the detaching at 120 and the attaching at 130, such as to improve and/or increase adhesion between the micropatterned dry adhesive and the cover plate.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entities in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" may mean A alone, B alone, C alone, A and B together, A and C together, B and C together, A, B, and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

As used herein, "at least substantially," when modifying a degree or relationship, may include not only the recited "substantial" degree or relationship, but also the full extent of the recited degree or relationship. A substantial amount of a recited degree or relationship may include at least 75% of the recited degree or relationship. For example, an object that is at least substantially formed from a material includes objects for which at least 75% of the objects are formed from the material and also includes objects that are completely formed from the material. As another example, a first length that is at least substantially as long as a second length includes first lengths that are within 75% of the second length and also includes first lengths that are as long as the second length.

Illustrative, non-exclusive examples of probe systems and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A probe system, comprising:

- a chuck that defines a support surface configured to support a substrate that includes a device under test;
- a cover plate, optionally that defines a chuck-facing side, which faces toward the support surface, and a chuck-opposed side, which faces away from the support surface;
- a probe positioner that includes a positioner base, a manipulator that extends from the positioner base, and a probe arm that extends from the manipulator;
- a probe operatively attached to the probe arm; and
- a positioner attachment structure that separably attaches the positioner base to the cover plate, or to the chuck-opposed side of the cover plate, wherein the positioner attachment structure includes an attachment structure body that defines a positioner base-facing side and a cover plate-facing side, wherein the positioner attachment structure further includes an adhesive material that adheres the positioner base-facing side to the positioner base, and further wherein the cover plate-facing side of the attachment structure body defines a micropatterned dry adhesive that separably attaches the attachment structure body to the cover plate.

A2. The probe system of paragraph A1, wherein the micropatterned dry adhesive includes at least one of a 3-D printed micropatterned dry adhesive and a lithographically defined micropatterned dry adhesive.

A3. The probe system of any of paragraphs A1-A2, wherein the micropatterned dry adhesive includes a plurality of surface extensions that extend away from the positioner base-facing side of the attachment structure body.

A4. The probe system of paragraph A3, wherein the plurality of surface extensions define a two-dimensional array of surface extensions.

A5. The probe system of any of paragraphs A3-A4, wherein the surface extensions include at least one of:

(i) columns;
(ii) pillars;
(iii) cylinders; and
(iv) filaments.

A6. The probe system of any of paragraphs A3-A5, wherein a pitch, or an average pitch, between adjacent surface extensions of the plurality of surface extensions is at least one of:

(i) at least 20 μm, at least 25 μm, at least 30 μm, at least 35 μm, at least 40 μm, at least 45 μm, at least 50 μm, at least 55 μm, at least 60 μm, at least 65 μm, at least 70 μm, at least 75 μm, or at least 80 μm; and
(ii) at most 120 μm, at most 110 μm, at most 100 μm, at most 90 μm, at most 80 μm, at most 70 μm, at most 60 μm, at most 50 μm, at most 40 μm, or at most 30 μm.

A7. The probe system of any of paragraphs A3-A6, wherein an average transverse diameter, or effective diameter, of the plurality of surface extensions is at least one of:

(i) at least 10 μm, at least 15 μm, at least 20 μm, at least 25 μm, or at least 30 μm; and
(ii) at most 60 μm, at most 55 μm, at most 50 μm, at most 45 μm, at most 40 μm, at most 35 μm, at most 30 μm, at most 25 μm, or at most 20 μm.

A8. The probe system of any of paragraphs A3-A7, wherein an average longitudinal length of the plurality of surface extensions is at least one of:

(i) at least 25 μm, at least 30 μm, at least 35 μm, at least 40 μm, at least 45 μm, at least 50 μm, at least 55 μm, at least 60 μm, at least 65 μm, at least 70 μm, at least 75 μm, or at least 80 μm; and
(ii) at most 120 μm, at most 110 μm, at most 100 μm, at most 90 μm, at most 80 μm, at most 70 μm, at most 60 μm, at most 50 μm, or at most 40 μm.

A9. The probe system of any of paragraphs A3-A8, wherein each surface extension of the plurality of surface extensions defines a free end region, which is in contact with the cover plate.

A10. The probe system of paragraph A9, wherein the free end region is a suction cup-shaped region.

A11. The probe system of any of paragraphs A9-A10, wherein the free end region is at least partially concave.

A12. The probe system of any of paragraphs A9-A11, wherein the free end region defines a cover plate-contacting pad.

A13. The probe system of any of paragraphs A1-A12, wherein a pull-off force between the micropatterned dry adhesive and the cover plate is at least one of:

(i) at least 1 kilogram per centimeter squared ($kg/cm^2$), at least 1.2 $kg/cm^2$, at least 1.4 $kg/cm^2$, at least 1.6 $kg/cm^2$, at least 1.8 $kg/cm^2$, or at least 2 $kg/cm^2$; and
(ii) at most 4 $kg/cm^2$, at most 3.5 $kg/cm^2$, at most 3 $kg/cm^2$, at most 2.5 $kg/cm^2$, or at most 2 $kg/cm^2$.

A14. The probe system of paragraph A13, wherein a pull-off force between the adhesive material and the positioner base is greater than the pull-off force between the micropatterned dry adhesive and the cover plate.

A15. The probe system of any of paragraphs A13-A14, wherein a pull-off force between the adhesive material and the positioner base-facing side of the attachment structure body is greater than the pull-off force between the micropatterned dry adhesive and the cover plate.

A16. The probe system of any of paragraphs A1-A15, wherein the attachment structure body is defined by at least one of an elastomeric material, a polymeric material, and an elastomeric polymer.

A17. The probe system of any of paragraphs A1-A16, wherein the adhesive material is in direct physical contact with both the positioner base-facing side of the attachment structure body and the positioner base.

A18. The probe system of any of paragraphs A1-A17, wherein the micropatterned dry adhesive is in direct physical contact with the cover plate.

A19. The probe system of any of paragraphs A1-A18, wherein the micropatterned dry adhesive is configured to facilitate repeated attachment to, and detachment from, the cover plate without damage to the micropatterned dry adhesive.

A20. The probe system of any of paragraphs A1-A19, wherein the micropatterned dry adhesive is configured to adhere to the cover plate via, or only via, Van der Waals forces.

A21. The probe system of any of paragraphs A1-A20, wherein the micropatterned dry adhesive is configured to facilitate detachment from the cover plate responsive to at least one of:

(i) a normal force between the positioner base and the cover plate exceeding a threshold normal force magnitude;

(ii) a rotational force between the positioner base and the cover plate exceeding a threshold rotational force magnitude; and (iii) a separation force between the positioner base and the cover plate exceeding a/the pull-off force between the micropatterned dry adhesive and the cover plate.

A22. The probe system of any of paragraphs A1-A21, wherein the positioner attachment structure further includes an actuator configured to facilitate detachment of the micropatterned dry adhesive from the cover plate.

A23. The probe system of paragraph A22, wherein the actuator is configured to press against the cover plate to generate at least one of a separation force and a separation torque that separates at least a region of the micropatterned dry adhesive from the cover plate.

A24. The probe system of any of paragraphs A22-A23, wherein the actuator includes at least one of a lever arm and a button configured to provide a mechanical advantage to separate at least a/the region of the micropatterned dry adhesive from the cover plate.

A25. The probe system of any of paragraphs A22-A24, wherein the actuator is configured to at least one of translate and rotate the positioner attachment structure relative to the cover plate.

A26. The probe system of paragraph A25, wherein the actuator defines:

(i) an attached orientation in which the actuator permits contact between the micropatterned dry adhesive and the cover plate; and (ii) a detached orientation in which the micropatterned dry adhesive is inaccessible to the cover plate.

A27. The probe system of any of paragraphs A1-A26, wherein the positioner attachment structure is configured to permit separable attachment of the positioner base to the cover plate at any desired location on the cover plate.

A28. The probe system of any of paragraphs A1-A27, wherein the position attachment structure is configured to permit an infinite number of attached relative orientations between the positioner base and the cover plate.

A29. The probe system of any of paragraphs A1-A28, wherein at least one of the probe system and the positioner attachment structure is free of a vacuum attachment mechanism between the probe positioner and the cover plate.

A30. The probe system of any of paragraphs A1-A29, wherein at least one of the probe system and the positioner attachment structure is free of a magnetic attachment mechanism between the probe positioner and the cover plate.

A31. The probe system of any of paragraphs A1-A30, wherein the positioner attachment structure is free of a ferromagnetic material.

A32. The probe system of any of paragraphs A1-A31, wherein at least one of the probe system and the positioner attachment structure is free of a mechanical fastener that extends between the probe positioner and the cover plate.

A33. The probe system of any of paragraphs A1-A32, wherein at least one of the probe system and the positioner attachment structure is configured to facilitate attachment of the probe positioner to the cover plate and detachment of the probe positioner from the cover plate without utilizing at least one of:

(i) a tool;

(ii) a separate tool that is distinct from the positioner attachment structure;

(iii) a screwdriver; and (iv) a wrench.

A34. The probe system of any of paragraphs A1-A33, wherein the chuck includes, or is, a vacuum chuck.

A35. The probe system of any of paragraphs A1-A34, wherein the chuck includes, or is, a temperature-controlled chuck.

A36. The probe system of any of paragraphs A1-A35, wherein the chuck includes, or is, an electrically shielded chuck.

A37. The probe system of any of paragraphs A1-A36, wherein the cover plate includes, or is, a metallic cover plate, optionally wherein the metallic cover plate defines at least one of:

(i) the chuck-facing side; and (ii) the chuck-opposed side.

A38. The probe system of any of paragraphs A1-A37, wherein the cover plate includes a glass cover plate, optionally wherein the glass cover plate defines the chuck-opposed side.

A39. The probe system of any of paragraphs A1-A38, wherein the cover plate defines a chuck-opposed side surface roughness of at most 5 μm Roughness Average (Ra), at most 4 μm Ra, at most 3 μm Ra, at most 2 μm Ra, at most 1 μm Ra, at most 0.8 μm Ra, at most 0.6 μm Ra, at most 0.5 μm Ra, at most 0.4 μm Ra, at most 0.3 μm Ra, at most 0.2 μm Ra, or at most 0.1 μm Ra.

A40. The probe system of any of paragraphs A1-A39, wherein the probe positioner is configured to operatively translate the probe, via motion of the probe arm, in at least one of:

(i) at least one direction;

(ii) at least two perpendicular, or at least substantially perpendicular, directions; and (iii) at least three orthogonal, or at least substantially orthogonal, directions.

A41. The probe system of any of paragraphs A1-A40, wherein the probe positioner is configured to operatively translate the probe, via motion of the probe arm, relative to at least one of:

(i) the support surface;

(ii) the cover plate; and (iii) the positioner base.

A42. The probe system of any of paragraphs A1-A41, wherein the probe positioner is at least one of:

(i) a manually actuated positioner; and (ii) an electrically actuated positioner.

A43. The probe system of any of paragraphs A1-A42, wherein the probe includes at least one of a contact probe, an electrical probe, a non-contact probe, and an electromagnetic probe.

B1. A method of operating a probe system, the method comprising:

detaching a probe positioner of the probe system from a first location on a cover plate of the probe system, wherein the detaching includes separating a micropatterned dry adhesive of a positioner attachment structure of the probe system from the cover plate while retaining the positioner attachment structure adhesively attached to a positioner base of the probe positioner; and attaching the probe positioner to a second location on the cover plate, wherein the second location differs from the first location, and further wherein the attaching includes contacting the micropatterned dry adhesive with the cover plate.

B2. The method of paragraph B1, wherein the detaching includes applying at least a threshold normal force between the positioner base and the cover plate to decrease a pull-off force between the micropatterned dry adhesive and the cover plate.

B3. The method of any of paragraphs B1-B2, wherein the detaching includes applying at least a threshold rotational force between the positioner base and the cover plate to decrease a/the pull-off force between the micropatterned dry adhesive and the cover plate.

B4. The method of any of paragraphs B1-B3, wherein the detaching includes applying a separation force, which is greater than a/the pull-off force between the micropatterned dry adhesive and the cover plate, between the positioner base and the cover plate.

B5. The method of any of paragraphs B1-B4, wherein the detaching includes actuating an actuator of the positioner attachment structure.

B6. The method of any of paragraphs B1-B5, wherein the attaching includes applying at least a threshold attachment force between the probe positioner base and the cover plate, wherein the threshold attachment force is sufficient to establish adhesion between the micropatterned dry adhesive and the cover plate.

B7. The method of any of paragraphs B1-B6, wherein the attaching includes actuating an/the actuator of the positioner attachment structure.

B8. The method of any of paragraphs B1-B7, wherein, prior to the detaching, the method further includes testing a test location of a device under test utilizing a probe of the probe system, wherein the probe is operatively attached to a probe arm that extends from the probe positioner, and further wherein the testing includes aligning the probe with the test location utilizing the probe positioner.

B9. The method of paragraph B8, wherein, subsequent to the attaching, the method further includes testing another test location of the device under test utilizing the probe.

B10. The method of paragraph B8, wherein the device under test is a first device under test, and further wherein the method includes testing another test location of another device under test, which differs from the device under test, utilizing the probe.

B11. The method of any of paragraphs B1-B10, wherein the detaching and the attaching are performed without actuating a vacuum attachment mechanism.

B12. The method of any of paragraphs B1-B11, wherein the detaching and the attaching are performed without utilizing a magnetic attachment mechanism.

B13. The method of any of paragraphs B1-B12, wherein the detaching and the attaching are performed without utilizing a mechanical fastener.

B14. The method of any of paragraphs B1-B13, wherein the detaching and the attaching are performed without utilizing at least one of:

(i) a tool;

(ii) a separate tool that is distinct from the positioner attachment structure;

(iii) a screwdriver; and (iv) a wrench.

B15. The method of any of paragraphs B1-B14, wherein the method includes sequentially repeating the detaching and the attaching a plurality of times, optionally without replacing the micropatterned dry adhesive of the positioner attachment structure.

B16. The method of any of paragraphs B1-B15, wherein the probe system includes any suitable structure, function, and/or feature of any of the probe systems of any of paragraphs A1-A43.

INDUSTRIAL APPLICABILITY

The probe systems and methods disclosed herein are applicable to the semiconductor manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A probe system, comprising:

a chuck that defines a support surface configured to support a substrate that includes a device under test;

a cover plate that defines a chuck-facing side, which faces toward the support surface, and a chuck-opposed side, which faces away from the support surface;

a probe positioner that includes a positioner base, a manipulator that extends from the positioner base, and a probe arm that extends from the manipulator;

a probe operatively attached to the probe arm; and a positioner attachment structure that separably attaches the positioner base to the cover plate, wherein the positioner attachment structure includes an attachment structure body that defines a positioner base-facing side and a cover plate-facing side, wherein the positioner attachment structure further includes an adhesive material that adheres the positioner base-facing side to the positioner base, and further wherein the cover plate-facing side of the attachment structure body defines a micropatterned dry adhesive that separably attaches the attachment structure body to the cover plate.

2. The probe system of claim 1, wherein the micropatterned dry adhesive includes a plurality of surface extensions that extend away from the positioner base-facing side of the attachment structure body.

3. The probe system of claim 2, wherein at least one of:

(i) a pitch between adjacent surface extensions of the plurality of surface extensions is at least 20 μm and at most 120 μm;

(ii) an average transverse diameter of the plurality of surface extensions is at least 10 μm and at most 60 μm; and (iii) an average longitudinal length of the plurality of surface extensions is at least 25 μm and at most 120 μm.

4. The probe system of claim 2, wherein each surface extension of the plurality of surface extensions defines a free end region, which is in contact with the cover plate, wherein the free end region is at least one of:

(i) a suction cup-shaped region;

(ii) at least partially concave; and (iii) defines a cover plate-contacting pad.

5. The probe system of claim 1, wherein a pull-off force between the micropatterned dry adhesive and the cover plate is at least 1 kilogram per centimeter squared ($kg/cm^2$) and at most 4 $kg/cm^2$, and wherein a pull-off force between the adhesive material and the positioner base is greater than the pull-off force between the micropatterned dry adhesive and the cover plate.

6. The probe system of claim 1, wherein the attachment structure body is defined by at least one of an elastomeric material, a polymeric material, and an elastomeric polymer.

7. The probe system of claim 1, wherein the micropatterned dry adhesive is in direct physical contact with the cover plate.

8. The probe system of claim 1, wherein the micropatterned dry adhesive is configured to facilitate repeated attachment to, and detachment from, the cover plate without damage to the micropatterned dry adhesive.

9. The probe system of claim 1, wherein the micropatterned dry adhesive is configured to adhere to the cover plate only via Van der Waals forces.

10. The probe system of claim 1, wherein the positioner attachment structure further includes an actuator configured to facilitate detachment of the micropatterned dry adhesive from the cover plate.

11. A method of operating a probe system, the method comprising:

detaching a probe positioner of the probe system from a first location on a cover plate of the probe system, wherein the detaching includes separating a micropatterned dry adhesive of a positioner attachment structure of the probe system from the cover plate while retaining the positioner attachment structure adhesively attached to a positioner base of the probe positioner; and attaching the probe positioner to a second location on the cover plate, wherein the second location differs from the first location, and further wherein the attaching includes contacting the micropatterned dry adhesive with the cover plate.

12. The method of claim 11, wherein the detaching includes at least one of:

(i) applying at least a threshold normal force between the positioner base and the cover plate to decrease a pull-off force between the micropatterned dry adhesive and the cover plate;

(ii) applying at least a threshold rotational force between the positioner base and the cover plate to decrease the pull-off force between the micropatterned dry adhesive and the cover plate; and (iii) applying a separation force, which is greater than the pull-off force between the micropatterned dry adhesive and the cover plate, between the positioner base and the cover plate.

13. The method of claim 11, wherein the attaching includes applying at least a threshold attachment force between the probe positioner base and the cover plate, wherein the threshold attachment force is sufficient to establish adhesion between the micropatterned dry adhesive and the cover plate.

14. The method of claim 11, wherein at least one of:

(i) the detaching includes actuating an actuator of the positioner attachment structure; and (ii) the attaching includes actuating the actuator of the positioner attachment structure.

15. The method of claim 11, wherein, prior to the detaching, the method further includes testing a test location of a device under test utilizing a probe of the probe system, wherein the probe is operatively attached to a probe arm that extends from the probe positioner, and further wherein the testing includes aligning the probe with the test location utilizing the probe positioner.

16. The method of claim 15, wherein, subsequent to the attaching, the method further includes testing another test location of the device under test utilizing the probe.

17. The method of claim 15, wherein the device under test is a first device under test, and further wherein the method includes testing another test location of another device under test, which differs from the device under test, utilizing the probe.

18. The method of claim 11, wherein the detaching and the attaching are performed at least one of:

(i) without actuating a vacuum attachment mechanism;

(ii) without utilizing a magnetic attachment mechanism; and (iii) without utilizing a mechanical fastener.

19. The method of claim 11, wherein the detaching and the attaching are performed without utilizing at least one of:

(i) a tool;

(ii) a separate tool that is distinct from the positioner attachment structure;

(iii) a screwdriver; and (iv) a wrench.

20. The method of claim 11, wherein the method includes sequentially repeating the detaching and the attaching a plurality of times, without replacing the micropatterned dry adhesive of the positioner attachment structure.

* * * * *